(12) United States Patent
Hsieh et al.

(10) Patent No.: US 9,076,553 B2
(45) Date of Patent: Jul. 7, 2015

(54) SPSRAM WRAPPER

(71) Applicant: Taiwan Semiconductor Manufacturing Company Limited, Hsin-Chu (TW)

(72) Inventors: Wei-jer Hsieh, Hsinchu (TW); Chiting Cheng, Taichung (TW); Chien-Kuo Su, Luzhu Township (TW); Cheng Hung Lee, Hsinchu (TW); Tsung-Yung Jonathan Chang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/078,754

(22) Filed: Nov. 13, 2013

(65) Prior Publication Data

US 2015/0131365 A1    May 14, 2015

(51) Int. Cl.
G11C 11/00 (2006.01)
G11C 11/418 (2006.01)
G11C 8/16 (2006.01)
G11C 8/18 (2006.01)

(52) U.S. Cl.
CPC ............... *G11C 11/418* (2013.01); *G11C 8/16* (2013.01); *G11C 8/18* (2013.01)

(58) Field of Classification Search
CPC .................................. G11C 5/14; G11C 11/412
USPC ................................................... 365/154, 226
See application file for complete search history.

(56) References Cited

U.S. PATENT DOCUMENTS

| | | |
|---|---|---|
| 5,319,596 A | 6/1994 | Kogure |
| 6,314,047 B1 * | 11/2001 | Keay et al. ............... 365/230.05 |
| 6,882,562 B2 | 4/2005 | Beucler |
| 7,206,239 B2 * | 4/2007 | Kikuchi et al. ............... 365/201 |
| 7,818,527 B2 * | 10/2010 | Kang ............................ 711/167 |

* cited by examiner

*Primary Examiner* — Michael Tran
(74) *Attorney, Agent, or Firm* — Cooper Legal Group, LLC

(57) ABSTRACT

Among other things, one or more techniques or systems for facilitating access operations to a single port memory device are provided. Multiple access operations to a single port memory device, such as a 6 transistor bitcell array of an SPSRAM, are performed during a single clock period of a system clock. In an embodiment, a wrapper controller initiates a first access operation during a first clock period of the system clock based upon a rising edge of the system clock. Responsive to receiving an operation complete signal during the first clock operation, the wrapper controller initiates a second access operation to the single port memory device during the first clock period. In this way, multi-port access functionality is implemented, such as in a serial manner to mitigate operation disturbs, for a single port memory device that occupies a relatively smaller area than a multi-port memory device for improved storage density.

20 Claims, 15 Drawing Sheets

SPSRAM WRAPPER

BACKGROUND

Memory devices comprise a vast number of bitcells within which information is stored. In an example, a dual port bitcell array comprises dual port bitcells that are individually constructed from 8 transistors. A dual port bitcell comprises two ports that operate independently of one another, such that a first port performs read/write operations independently of a second port performing read/write operations. Because the first port and the second port operate in parallel, operation disturbs arise where a first operation on the first port, such as a write operation, and a second operation on the second port, such as a read operation, result in a collision that would otherwise cause data inconsistencies if allowed. Because the dual port bitcell comprises 8 transistors, the dual port bitcell occupies a relatively large amount of area resulting in area penalty for the memory device.

DETAILED DESCRIPTION

Figure 1:
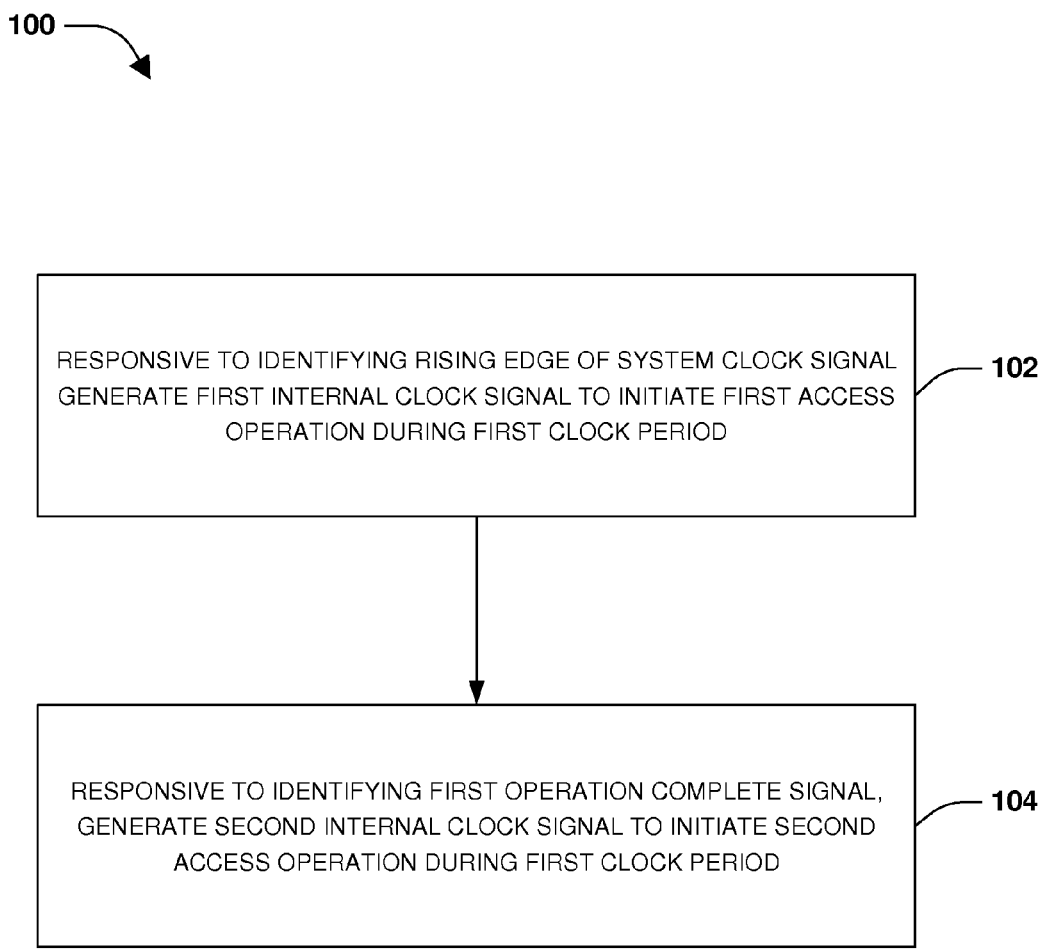
FIG. 1 is a flow diagram illustrating a method of facilitating access operations to a single port memory device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more techniques or systems for facilitating access operations to a single port memory device, such as a bitcell of an SPSRAM, are provided. In an embodiment, a single port memory device is constructed of a number of transistors, such as a 6 transistor bitcell, that is less than a number of transistors used to construct a dual port memory device, such as an 8 transistor bitcell. In this way, the single port memory device occupies a relatively smaller area than the dual port memory device. Thus, if single port memory devices are used within a memory device, then the memory device has greater storage density. As provided herein, a wrapper is configured to provide multi-port type access, such as dual port access, to the single port memory device. Because an area of the wrapper and the single port memory device is smaller than an area of the dual port memory device, the memory device comprising single port memory devices has greater storage density and has the ability for multi-port type access to the single port memory devices. Multiple access operations are performed within a single clock period of a system clock in a serial manner to mitigate operation disturbs that otherwise occur from parallel operation of the multi-port memory device.

Figure 2:
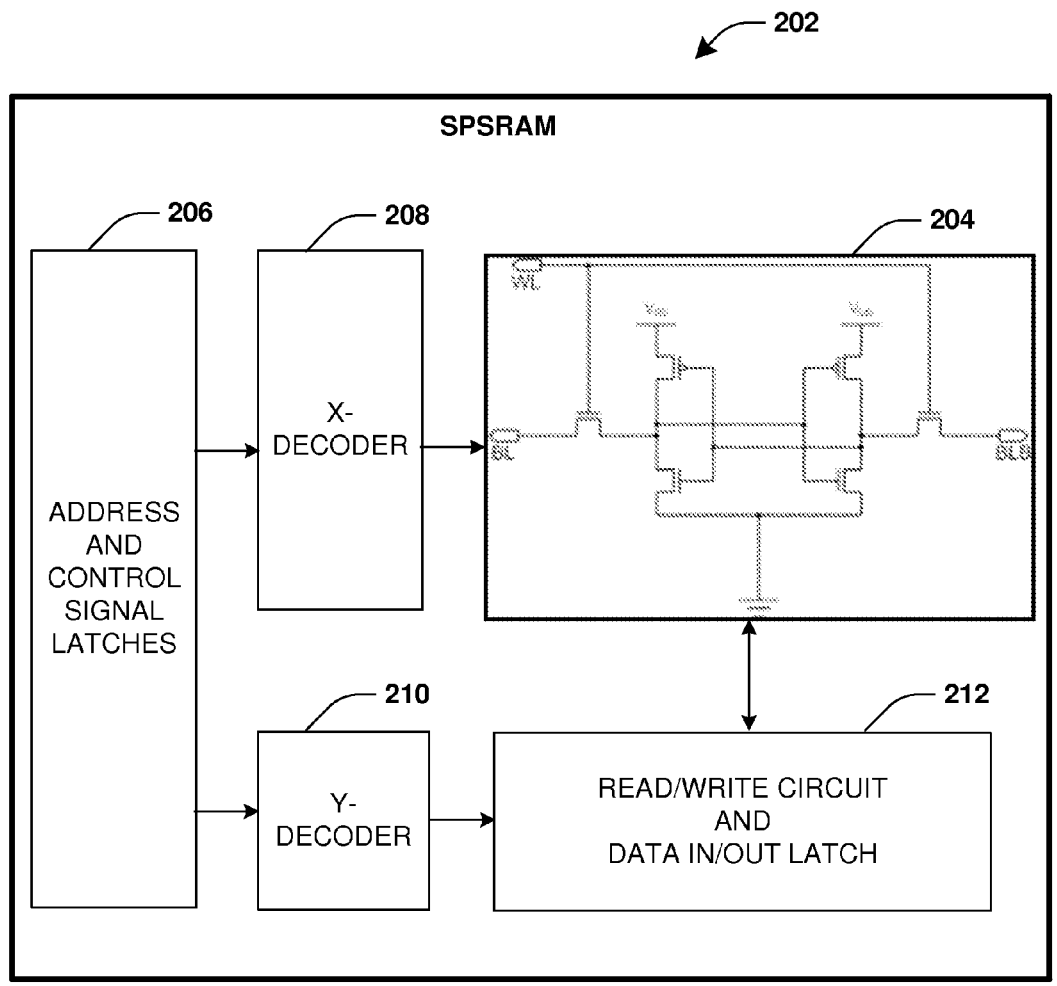
FIG. 2 is an illustration of a single port memory device, according to some embodiments.

A method 100 of facilitating access operations to a single port memory device is illustrated in FIG. 1. A memory device, such as SRAM memory, comprises one or more single port memory devices (SPSRAMs). An embodiment of a single port memory device 202 is illustrated in FIG. 2. The single port memory device 202 comprises a bitcell array 204, such as a 6 transistor bitcell array. In an embodiment, the single port memory device 202 comprises address and control signal latches 206 configured to receive and latch port input data, such as a port address, a chip enable signal, or a write enable signal. In an embodiment, the single port memory device 202 comprises an x-decoder 208 and a y-decoder 210 configured to identify a destination bitcell of an access operation based upon the port address received by the address and control signal latches 206. In an embodiment, the single port memory device 202 comprises a read/write circuit and data in/out latch 212 configured to receive and store data that is to be written to the bitcell array 204 or receive and store data that is being read from the bitcell array 204. As provided herein, multiple access operations are facilitated during a single clock period of a system clock.

At 102, a rising edge of a system clock signal is identified during a first clock period of a system clock. Based upon identifying the rising edge, a first internal clock signal is generated to initiate a first access operation to the single port memory device 202 during the first clock period. In an embodiment, a wrapper address component comprises a first port configured to receive at least one of a first chip enable signal or a first write enable signal that are used to determine whether to initiate the first access operation, such as a read operation or a write operation to a destination bitcell. In an embodiment, a multi-clock generator of a wrapper controller is configured to generate the first internal clock signal used to invoke the wrapper address component to initiate the first access operation. In an embodiment, a data wrapper is configured to transmit first data associated with the first access operation, such as data that is to be written to the single port memory device 202 or data that is read from the single port memory device 202. In an embodiment, the data wrapper transmits the first data without latching the first data (e.g., FIG. 3C). In an embodiment, the data wrapper latches the first data, and then transmits the first data to the single port memory device 202 (e.g., FIG. 3D). In this way, the first access operation to the single port memory device 202 is performed during the first clock period of the system clock.

At 104, a first operation complete signal, such as a clock reset signal, is identified from the single port memory device 202 during the first clock period of the system clock. In an embodiment, the single port memory device 202 generates the clock reset signal upon completion of the first access operation, and thus the clock reset signal is identified as the first operation complete signal. Based upon identifying the first operation complete signal, a second internal clock signal is generated to initiate a second access operation to the single port memory device 202 during the first clock period of the system clock. In an embodiment, the wrapper address component comprises a second port configured to receive at least one of a second chip enable signal or a second write enable signal that are used to determine whether to initiate the second access operation, such as a read operation or a write operation to a destination bitcell. In an embodiment, the multi-clock generator is configured to generate the second internal clock signal used to invoke the wrapper address component to initiate the second access operation. In an embodiment, the data wrapper is configured to transmit second data associated with the second access operation, such as data that is to be written to the single port memory device 202 or data that is read from the single port memory device 202. In this way, the second access operation to the single port memory device 202 is performed during the first clock period of the system clock. In an embodiment, the first access operation and the second access operation are performed serially, as opposed to in parallel, in order to mitigate operation disturb. In an embodiment, a plurality of access operations are facilitated during the first clock period of the system clock, such as a third access operation or other access operations.

Figure 3A:
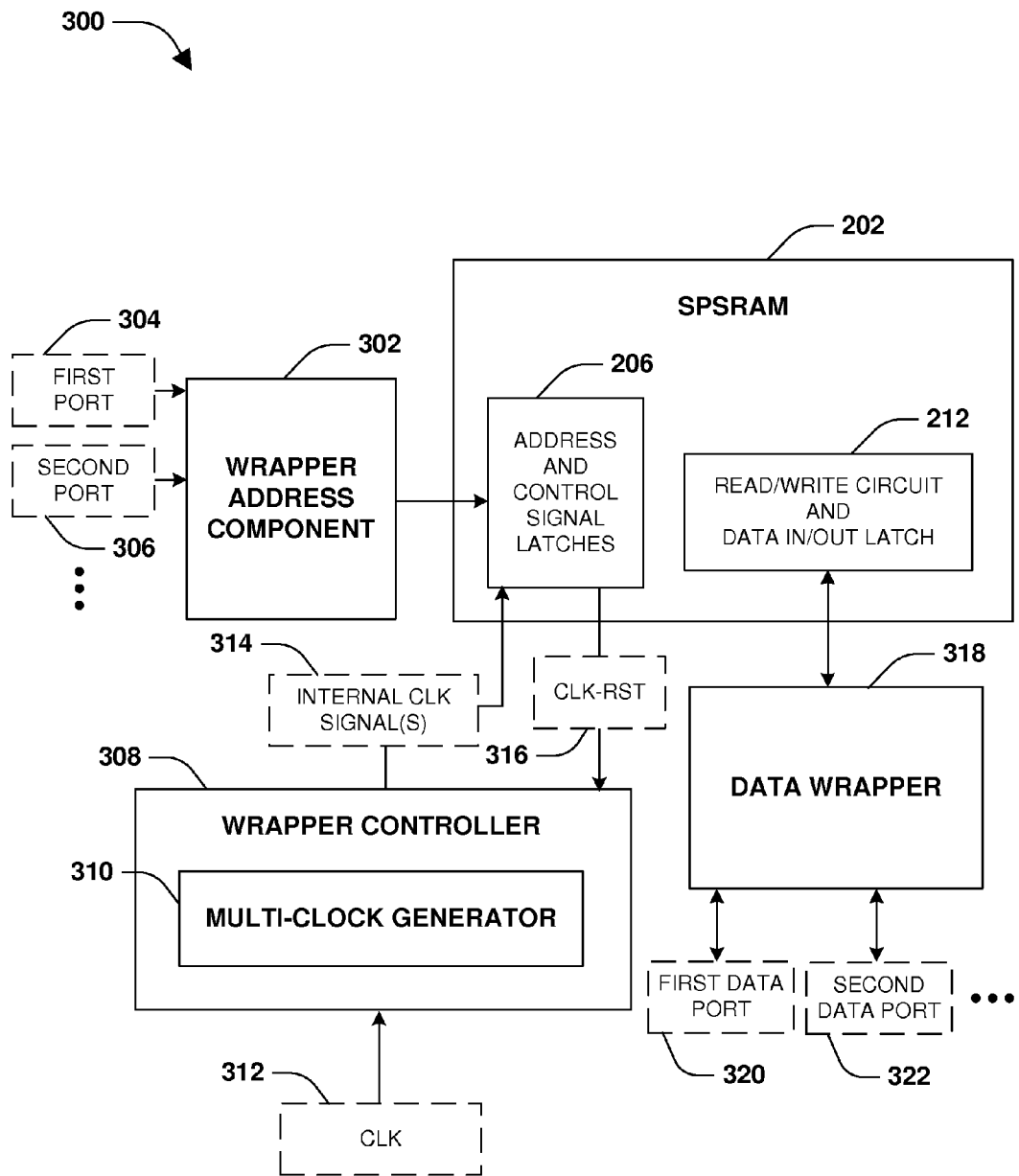
FIG. 3A is an illustration of a system for facilitating access operations to a single port memory device, according to some embodiments.

FIG. 3A illustrates a system 300 for facilitating access operations to a single port memory device 202. The system 300 comprises at least one of a wrapper address component 302, a data wrapper 318, or a wrapper controller 308 comprising a multi-clock generator 310. The wrapper address component 302 comprises one or more ports configured to transmit port inputs, such as a first port 304 configured to transmit a first port input and a second port 306 configured to transmit a second port input. In an embodiment, the first data port 304 is configured to receive or transmit the first port input, such as a first port address, a first chip enable signal, or a first write enable signal used to facilitate a first access operation. In an embodiment, the second data port 306 is configured to receive or transmit the second port input, such as a second port address, a second chip enable signal, or a second write enable signal used to facilitate a second access operation. In an embodiment, first data and the second data received by the wrapper address component 302 are used to determine whether to facilitate one or more access operations to the single port memory device 202.

The wrapper controller 308 is configured to evaluate a system clock signal 312 of a system clock. In an embodiment, the wrapper controller 308 initiates a first access operation from the first port 304 of the wrapper address component 302 to the single port memory device 202, such as to the address and control signal latches 206, during a first clock period of the system clock signal 312. In an embodiment, the first port address, specified by the first port input, is evaluated to identify a destination bitcell of the first access operation. The first chip enable signal and the first write enable signal, specified by the first port input, are evaluated to identify whether the first access operation is a read operation or a write operation. In an embodiment, the multi-clock generator 310 is configured to generate a first internal clock signal, such as internal clock signals 314 sent to the address and control signal latches 206, to initiate the first access operation during the first clock period of the system clock signal 312 based upon a rising edge of a system clock signal. The data wrapper 318 comprises a first data port 320 configured to transmit first data associated with the first access operation, such as data read from or written to the single port memory device 202 through the read/write circuit and data in/out latch 212. In this way, the first access operation is performed during the first clock period of the system clock signal 312.

The wrapper controller 308 is configured to receive a first operation complete signal, such as a clock reset signal 316, from the single port memory device 202. Responsive to identifying the first operation complete signal, the wrapper controller 308 is configured to initiate a second access operation from the second port 306 to the single port memory device 202, such as to the address and control signal latches 206, during the first clock period of the system clock signal 312. In an embodiment, the second port address, specified by the second port input, is evaluated to identify a destination bitcell of the second access operation. The second chip enable signal and the second write enable signal, specified by the second port input, are evaluated to identify whether the second access operation is a read operation or a write operation. In an embodiment, the multi-clock generator 310 is configured to generate a second internal clock signal, such as internal clock signals 314 sent to the address and control signal latches 206, based upon the clock reset signal 316. The second internal clock signal initiates the second access operation during the first clock period of the system clock signal 312. The data wrapper 318 comprises a second data port 322 configured to transmit second data associated with the second access operation, such as data read from or written to the single port memory device 202 through the read/write circuit and data in/out latch 212. In this way, the second access operation is performed during the first clock period of the system clock signal 312.

In an embodiment, the first access operation and the second access operation are performed serially, as opposed to in parallel, to mitigate operation disturb. In this way, a first read operation followed by a second read operation, a first read operation followed by a first write operation, a first write operation followed by a first read operation, a first write operation followed by a second write operation, or other combinations of read and write operations are capable of being performed during a single clock period of the system clock signal 312. In an embodiment, any number of access operations are performed during a single clock period of the system clock signal 312.

Figure 3B:
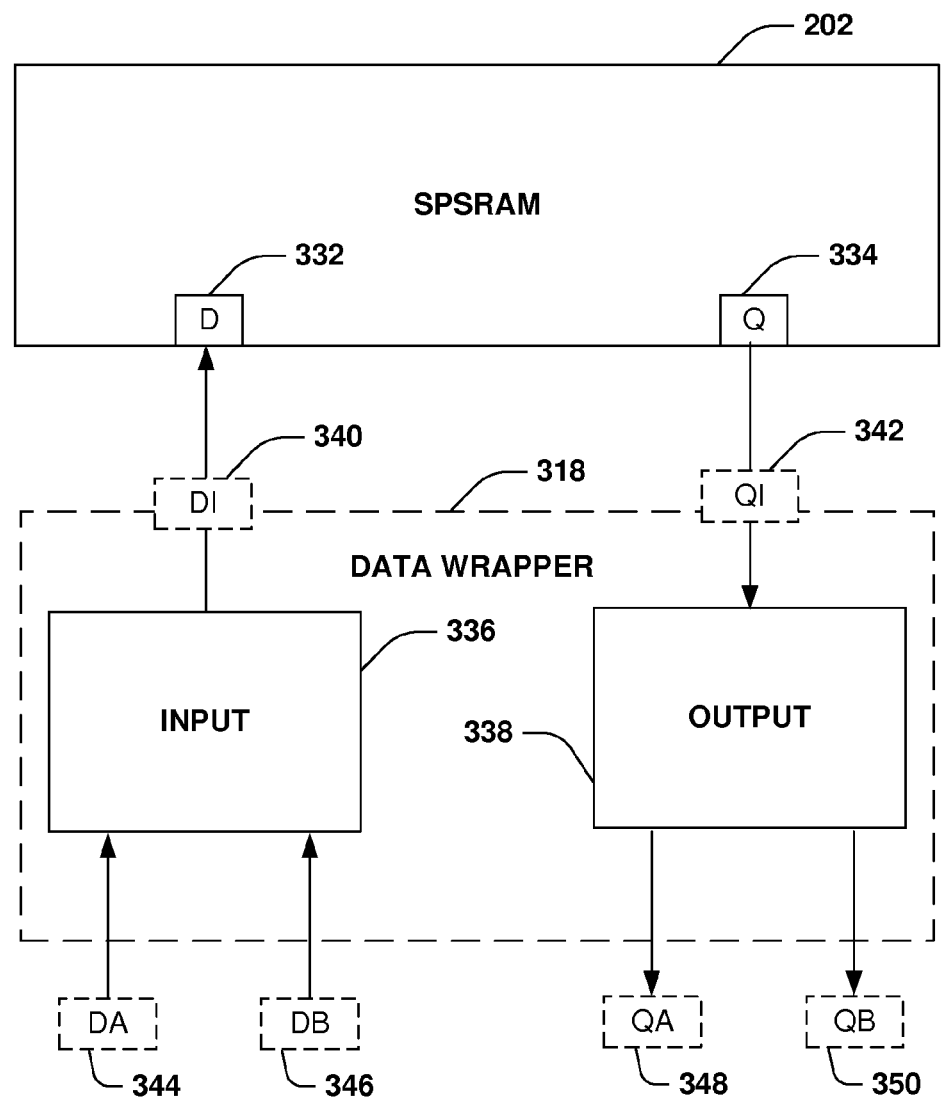
FIG. 3B is an illustration of managing data input and data output associated with a single port memory device, according to some embodiments.

FIG. 3B illustrates a data wrapper 318 managing data input 336 and data output 338 associated with the single port memory device 202. The single port memory device 202 comprises a data input port (D) 332 and a data output port (Q)

Figure 3C:
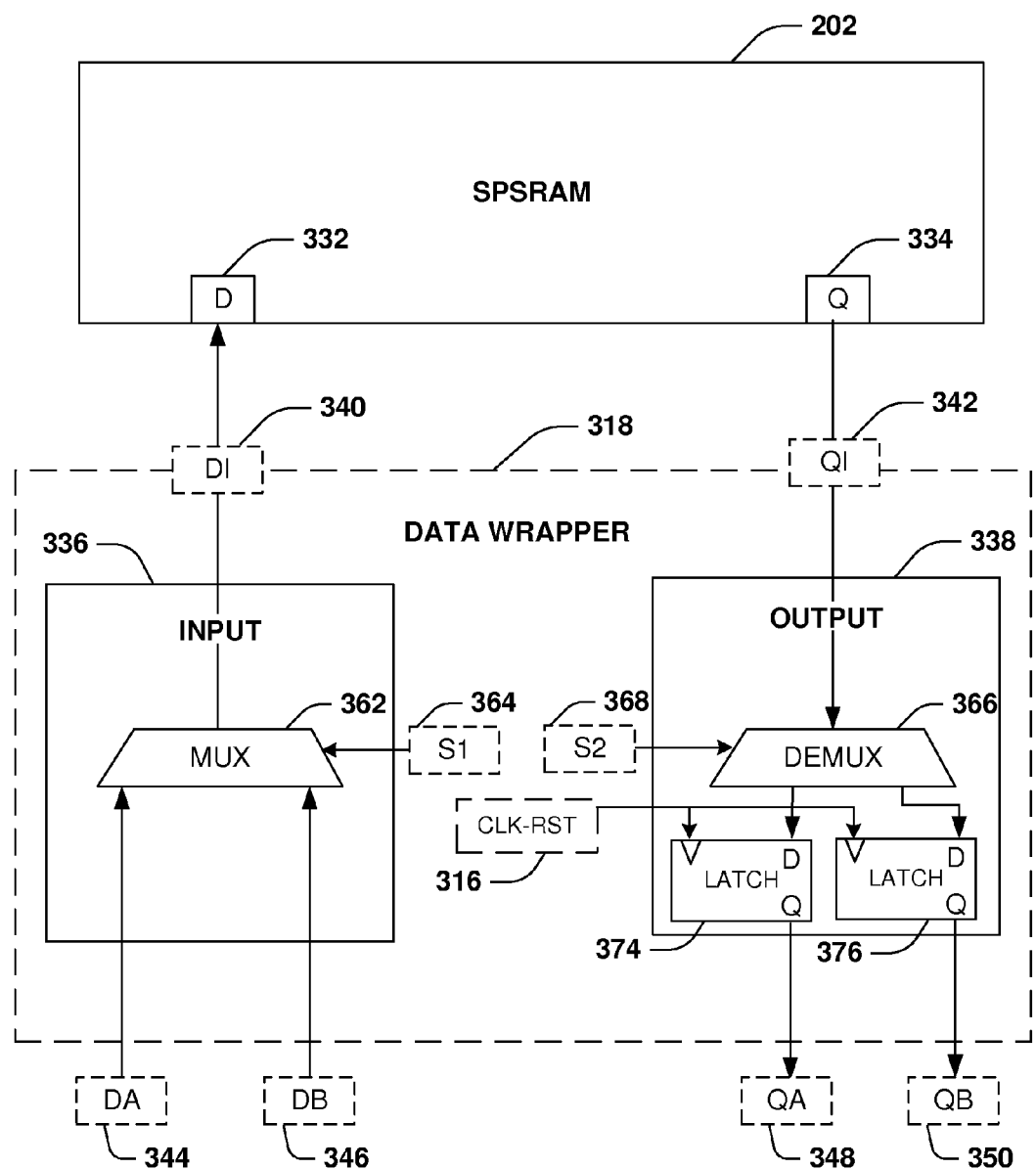
FIG. 3C is an illustration of managing data input and data output associated with a single port memory device, according to some embodiments.
Figure 3D:
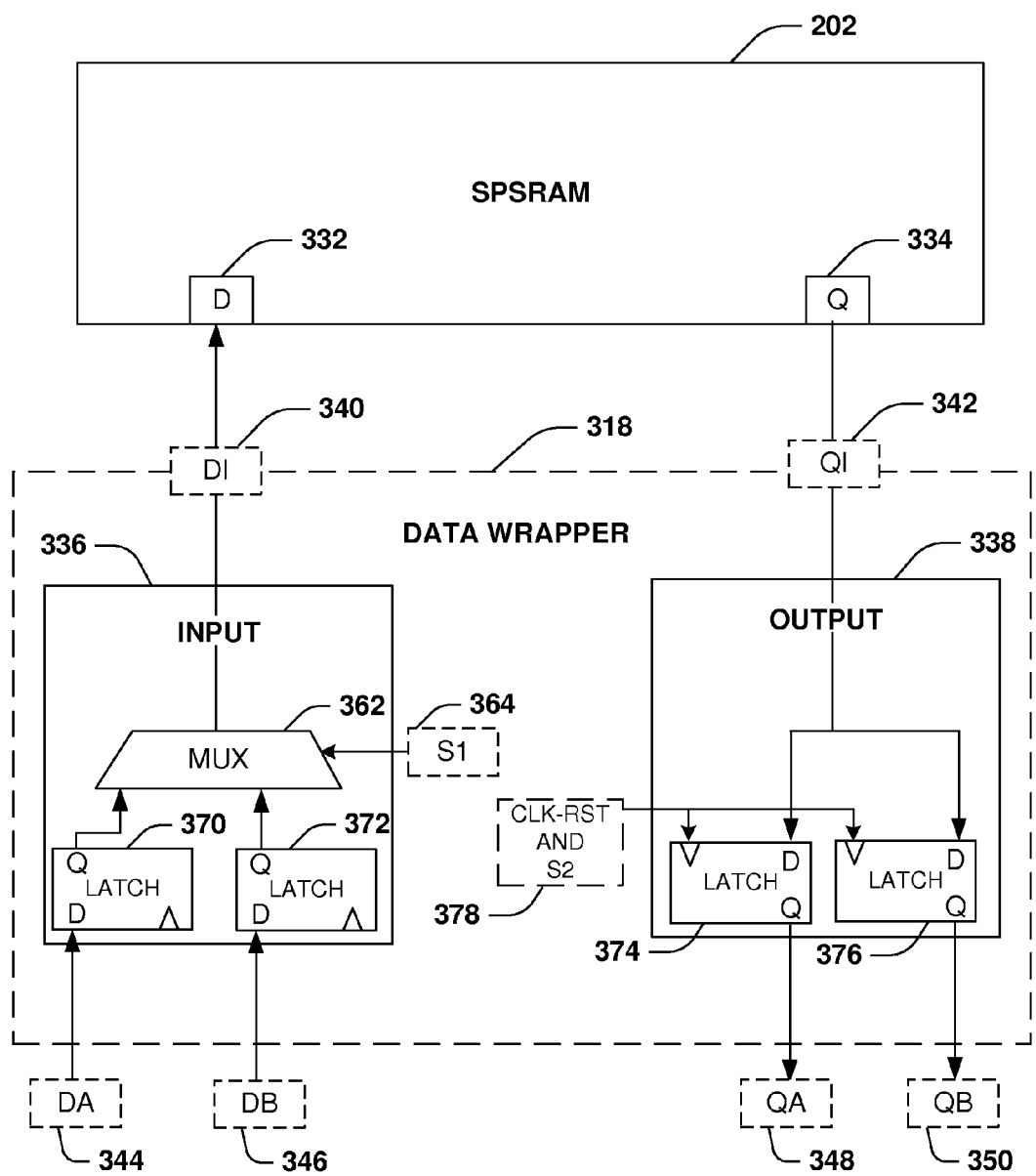
FIG. 3D is an illustration of managing data input and data output associated with a single port memory device, according to some embodiments.

334. In an embodiment of transmitting data to the single port memory device 202, the data wrapper 318 is configured to transmit a data input signal (D1) 340 to the data input port (D) 332 based upon a first data input (DA) 344 or a second data input port (DB) 346. In this way, data from the first data input (DA) 344 or the data input (DB) 346 is provided as the data input signal (D1) 340 to the data input port (D) 332 of the single port memory device 202, such as during one or more access operations during a single clock period of a system clock for the single port memory device 202. In an embodiment, the data wrapper 318 utilizes a multiplexer (MUX) 362, but not a data latch, for managing the data input 336, as illustrated in FIG. 3C. The MUX 362 selects the first data input (DA) 344 or the second data input (DB) 346 based upon a select signal (S1) 364 from the wrapper controller 308. In this way, the data wrapper 318 manages input into the single port memory device 202 utilizing the MUX 362 without latching data, according to some embodiments. It is appreciated that waveform 700, waveform 900, and waveform 1100 illustrate data access operations performed without utilizing a latch. In an embodiment, the data wrapper 318 utilizes the MUX 362 and one or more latches, such as data latch 370 and data latch 372, for managing the data input 336, as illustrated in FIG. 3D. The data latch 370 is configured to latch the first data input (DA) 344. The data latch 372 is configured to latch the second data input (DB) 346. The MUX 362 selects the first data input (DA) 344 latched within the latch 370 or the second data input (DB) 346 latched within the latch 372 based upon the select signal (51) 364 from the wrapper controller 308. In this way, the data wrapper 318 manages input into the single port memory device 202 utilizing the MUX 362 and one or more latches, according to some embodiments. It is appreciated that waveform 800, waveform 1000, and waveform 1200 illustrate data access operations performed utilizing a latch.

In an embodiment of reading data from the single port memory device 202, the data wrapper 318 is configured to receive a data output signal (QI) 342 from the data output port (Q0 334 of the single port memory device 202, as illustrated in FIG. 3B. The data output signal (QI) 342 is outputted through a first data output (QA) 348 or a second data output (QB) 350. In this way, data that is read from the single port memory device 202 is available through the first data output (QA) 348 or the second data output (QB) 350, such as during one or more access operations during a single clock period of a system clock for the single port memory device 202. In an embodiment, the data wrapper 318 utilizes a demultiplexer (DEMUX) 366 and one or more latches, such as latch 374 and latch 376, for managing the data output 338, as illustrated in FIG. 3C. The DEMUX 366 receives the data output signal (QI) 342 from the data output port (Q) 334 of the single port memory device 202, and provides the data output signal (QI) 342 to the latch 374 or the latch 376 based upon a select signal (S2) 368 from the wrapper controller 308. In this way, the data output signal (QI) 342 is available as the first data output (QA) 348 or the second data output (QB) 350 during one or more access operations during a single clock period of the system clock, according to some embodiments. In an embodiment, the data wrapper 318 comprises one or more latches, such as data latch 374 and data latch 376, but does not comprise a demultiplexer for managing data output 338, as illustrated in FIG. 3D. The data latch 374 is configured to latch the data output signal (QI) 342 for access as the first data output (QA) 348 based upon a clock reset and select signal (CLK-RST and S2) 378. The data latch 376 is configured to latch the data output signal (QI) 342 for access as the second data output (QB) 350 based upon the clock reset and select signal (CLK-RST and S2) 378. In this way, the data wrapper 318 manages output from the single port memory device 202 utilizing the one or more latches during one or more access operations during a single clock period of the system clock, according to some embodiments.

Figure 4:
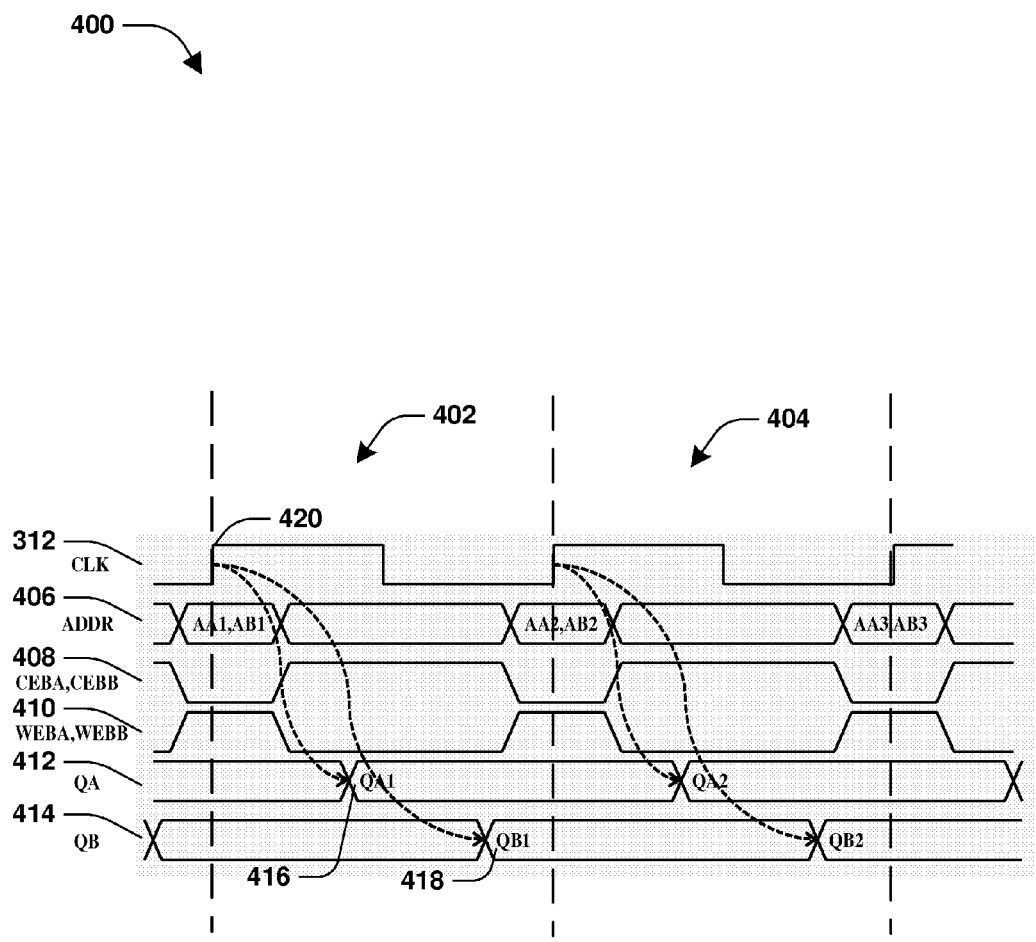
FIG. 4 is an illustration of a waveform of a first read operation and a second read operation performed during a first clock period of a system clock, according to some embodiments.

FIG. 4 is an illustration of a waveform 400 of a first read operation 416 and a second read operation 418 performed during a first clock period 402 of a system clock signal 312. The system clock signal 312 comprises one or more clock periods, such as the first clock period 402 and a second clock period 404, during which multiple access operations to a single port memory device 202 are facilitated. In an embodiment, a multi-clock generator 310 generates a first internal clock signal to initiate a first access operation (first read operation 416) to the single port memory device 202 based upon detecting a rising edge 420 of the system clock signal 312. An address signal 406 represents a first port address (AA1) received by a first port 304 of a wrapper address component 302. The first port address (AA1) is evaluated to identify a destination bitcell for the first access operation (first read operation 416). A chip enable signal 408 represents a first chip enable signal (CEBA) received by the first port 304. A write enable signal 410 represents a first write enable signal (WEBA) received by the first port 304. The first chip enable signal (CEBA) and the first write enable signal (WEBA) are evaluated to determine that the first access operation (first read operation 416) is a read operation, as opposed to a write operation, to the single port memory device 202. A first data signal 412 represents first data (QA1) that is read from the single port memory device 202 by the first read operation 416 during the first clock period 402. Accordingly, the first read operation 416 to the single port memory device 202 is performed during the first clock period 402 based upon the rising edge 420 of the system clock signal 312.

In an embodiment, the multi-clock generator 310 generates a second internal clock signal to initiate a second access operation (second read operation 418) to the single port memory device 202 based upon detecting a first operation complete signal, such as a clock reset signal. The address signal 406 represents a second port address (AB1) received by a second port 306 of the wrapper address component 302. The second port address (AB1) is evaluated to identify a destination bitcell for the second access operation (second read operation 418). The chip enable signal 408 represents a second chip enable signal (CEBB) received by the second port 304. The write enable signal 410 represents a second write enable signal (WEBB) received by the second port 306. The second chip enable signal (CEBB) and the second write enable signal (WEBB) are evaluated to determine that the second access operation (second read operation 418) is a read operation, as opposed to a write operation, to the single port memory device 202. A second data signal 414 represents second data (QB1) that is read from the single port memory device 202 by the second read operation 418 during the first clock period 402. Accordingly, the second read operation 418 to the single port memory device 202 is performed during the first clock period 402 based upon the first operation complete signal.

Figure 5:
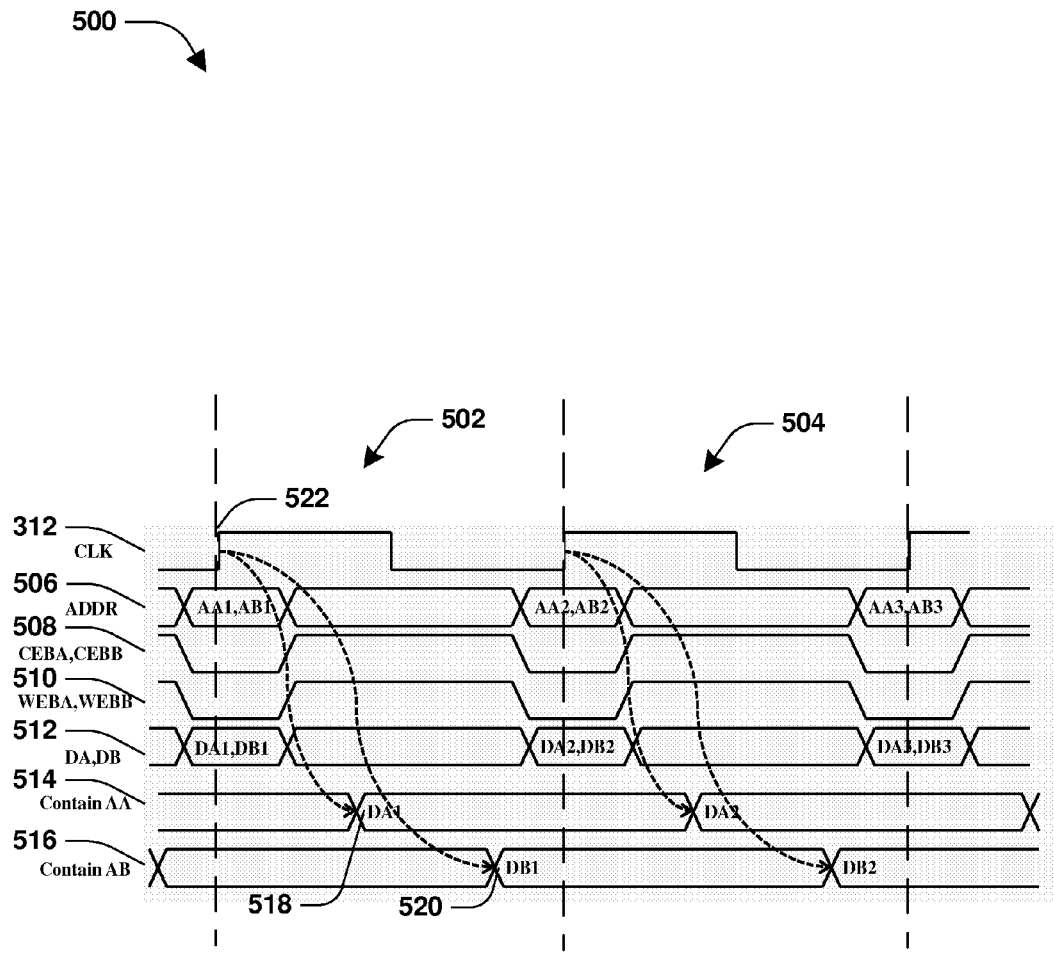
FIG. 5 is an illustration of a waveform of a first write operation and a second write operation performed during a first clock period of a system clock, according to some embodiments.

FIG. 5 is an illustration of a waveform 500 of a first write operation 518 and a second write operation 520 performed during a first clock period 502 of a system clock signal 312. The system clock signal 312 comprises one or more clock periods, such as the first clock period 502 and a second clock period 504, during which multiple access operations to a single port memory device 202 are facilitated. In an embodiment, a multi-clock generator 310 generates a first internal clock signal to initiate a first access operation (first write operation 518) to the single port memory device 202 based upon detecting a rising edge 520 of the system clock signal 312. An address signal 506 represents a first port address (AA1) received by a first port 304 of a wrapper address component 302. The first port address (AA1) is evaluated to identify a destination bitcell for the first access operation (first write operation 518). A chip enable signal 508 represents a first chip enable signal (CEBA) received by the first port 304. A write enable signal 510 represents a first write enable signal (WEBA) received by the first port 304. The first chip enable signal (CEBA) and the first write enable signal (WEBA) are evaluated to determine that the first access operation (first write operation 518) is a write operation, as opposed to a read operation, to the single port memory device 202. A data signal 512 represents first data (DA1) that is to be written to the single port memory device 202 by the first write operation 518 during the first clock period 502. Accordingly, the first write operation 518 to the single port memory device 202 is performed during the first clock period 502 based upon the rising edge 520 of the system clock signal 312. A first contain signal 514 represents the first data (DA1) written to the single port memory device 202 by the first write operation 518.

In an embodiment, the multi-clock generator 310 generates a second internal clock signal to initiate a second access operation (second write operation 520) to the single port memory device 202 based upon detecting a first operation complete signal, such as a clock reset signal. The address signal 506 represents a second port address (AB1) received by a second port 306 of the wrapper address component 302. The second port address (AB1) is evaluated to identify a destination bitcell for the second access operation (second write operation 520). The chip enable signal 508 represents a second chip enable signal (CEBB) received by the second port 304. The write enable signal 510 represents a second write enable signal (WEBB) received by the second port 306. The second chip enable signal (CEBB) and the second write enable signal (WEBB) are evaluated to determine that the second access operation (second write operation 520) is a write operation, as opposed to a read operation, to the single port memory device 202. The data signal 512 represents second data (DB1) that is to be written to the single port memory device 202 by the second write operation 520 during the first clock period 502. Accordingly, the second write operation 520 to the single port memory device 202 is performed during the first clock period 502 based upon the first operation complete signal. A second contain signal 516 represents the second data (DB1) written to the single port memory device 202 by the second write operation 520.

Figure 6:
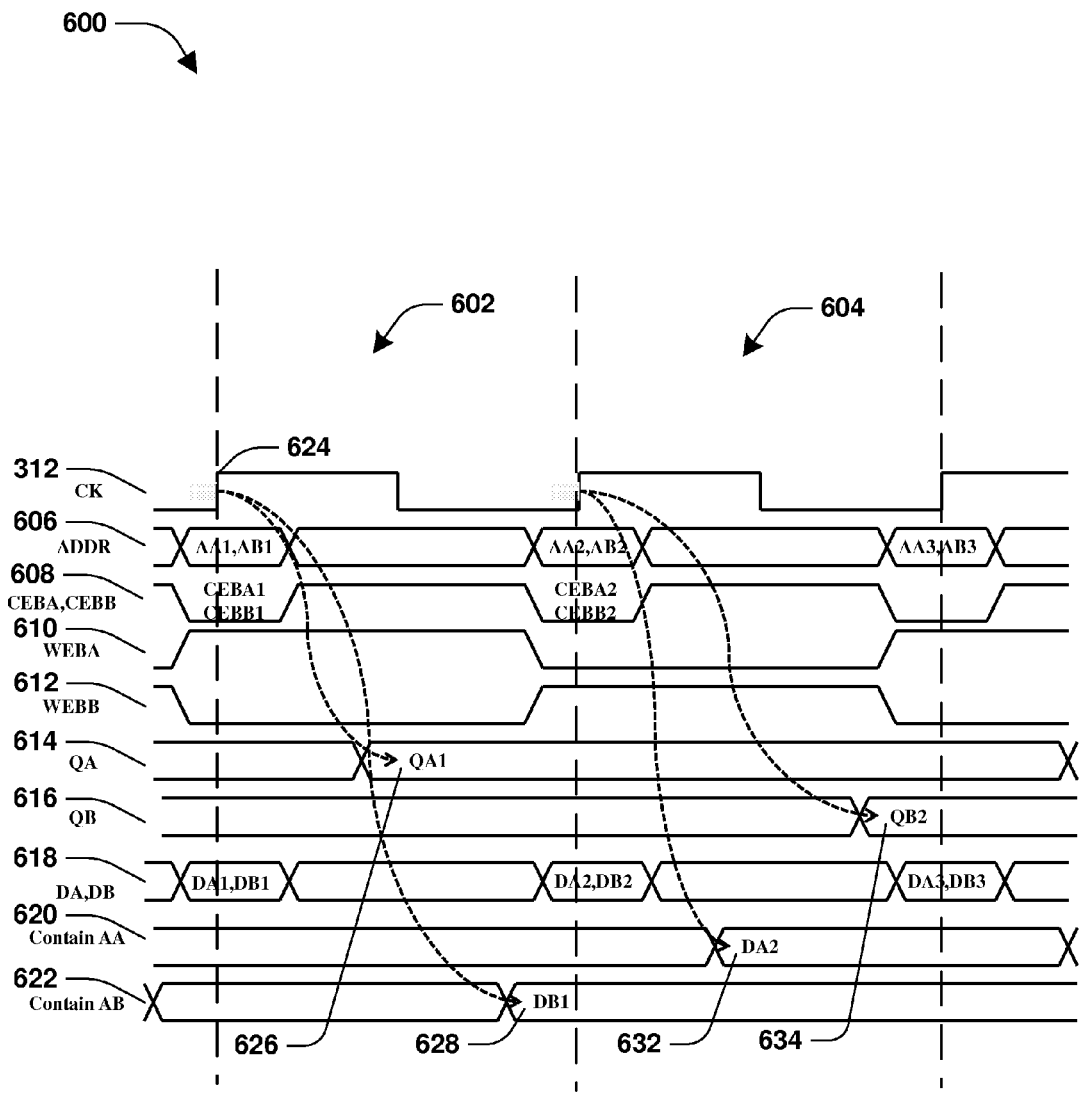
FIG. 6 is an illustration of a waveform of a first read operation and a second write operation performed during a first clock period of a system clock, and a first write operation and a second read operation performed during a second clock period of the system clock, according to some embodiments.
Figure 7:
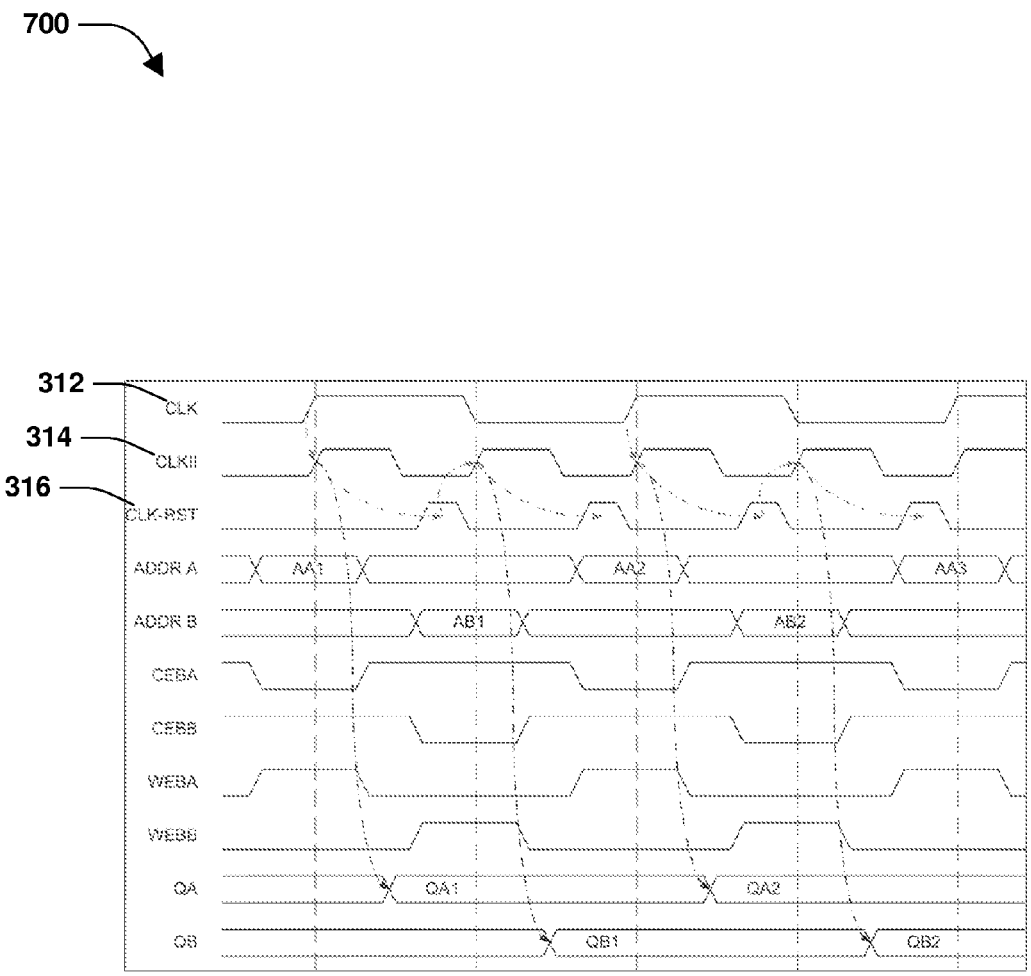
FIG. 7 is an illustration of a waveform of facilitating one or more access operations without utilizing a latch, according to some embodiments.
Figure 8:
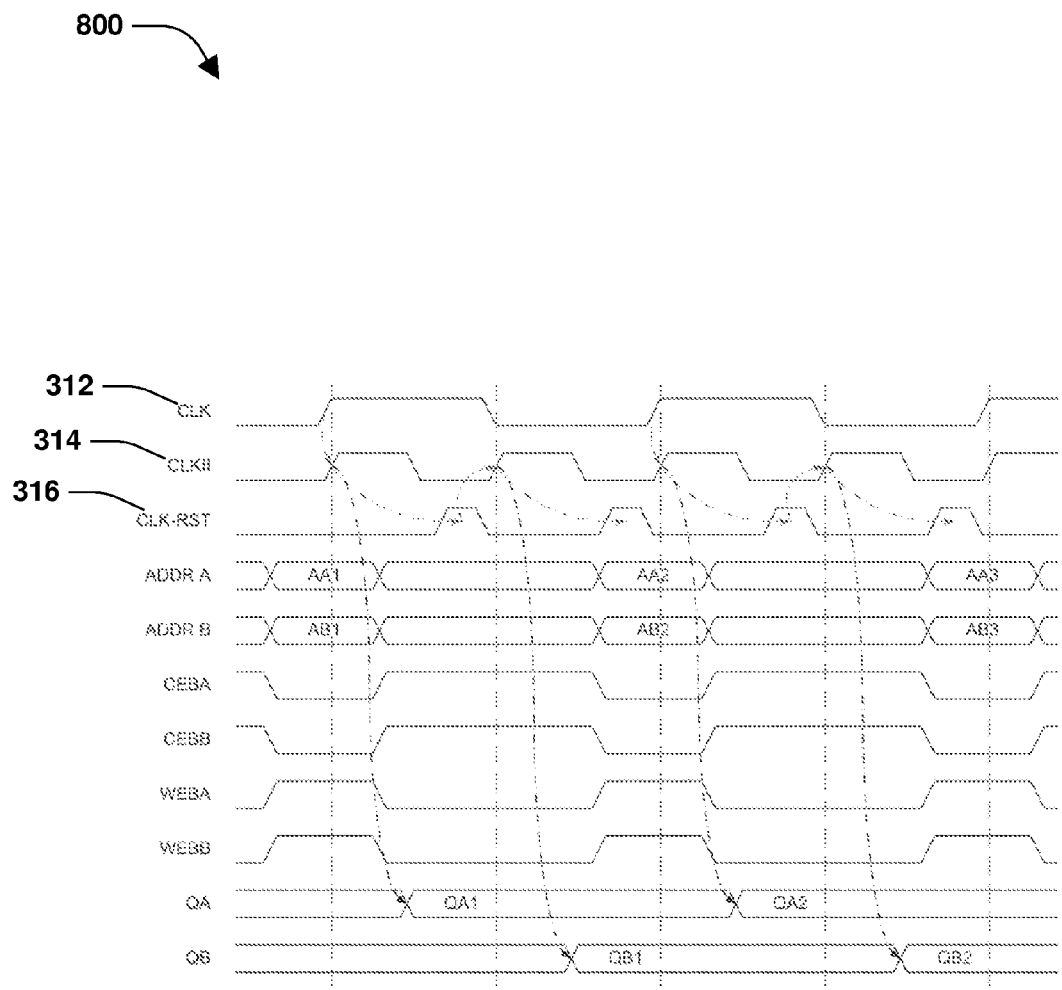
FIG. 8 is an illustration of a waveform of facilitating one or more access operations with utilizing a latch, according to some embodiments.
Figure 9:
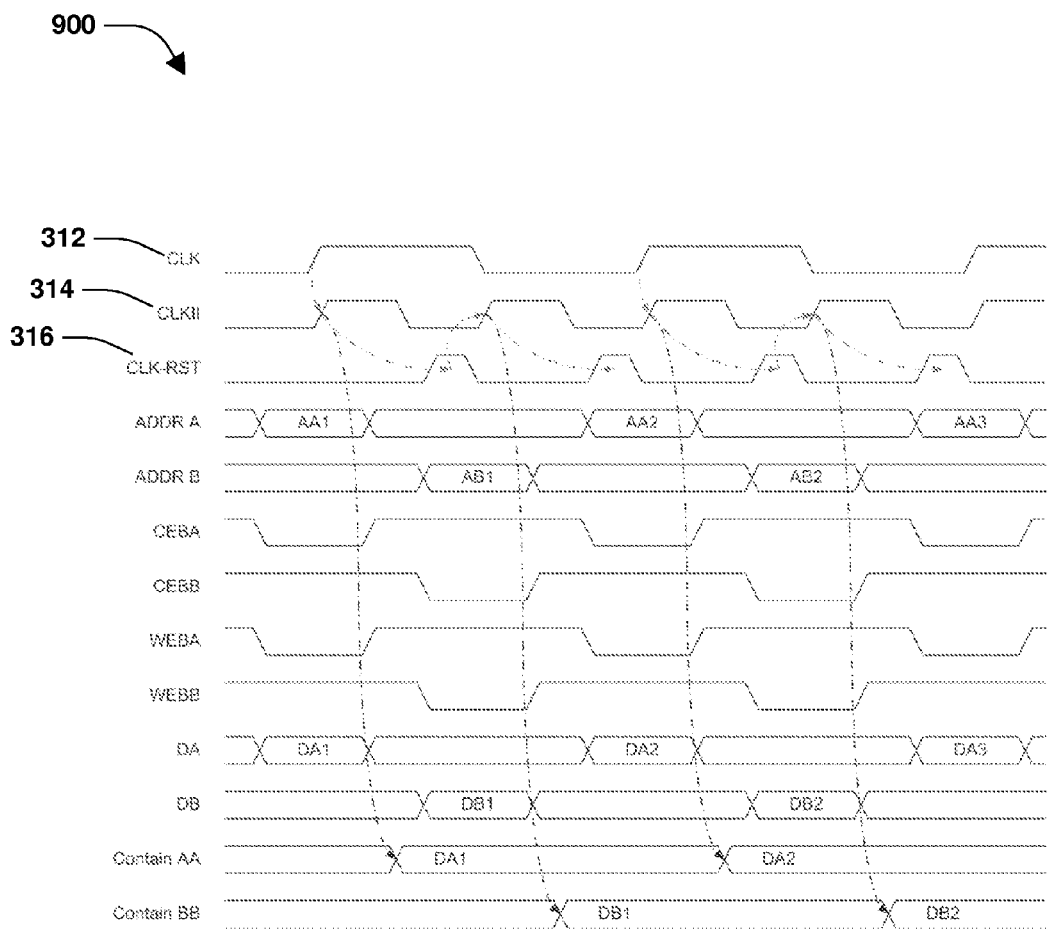
FIG. 9 is an illustration of a waveform of facilitating one or more access operations without utilizing a latch, according to some embodiments.
Figure 10:
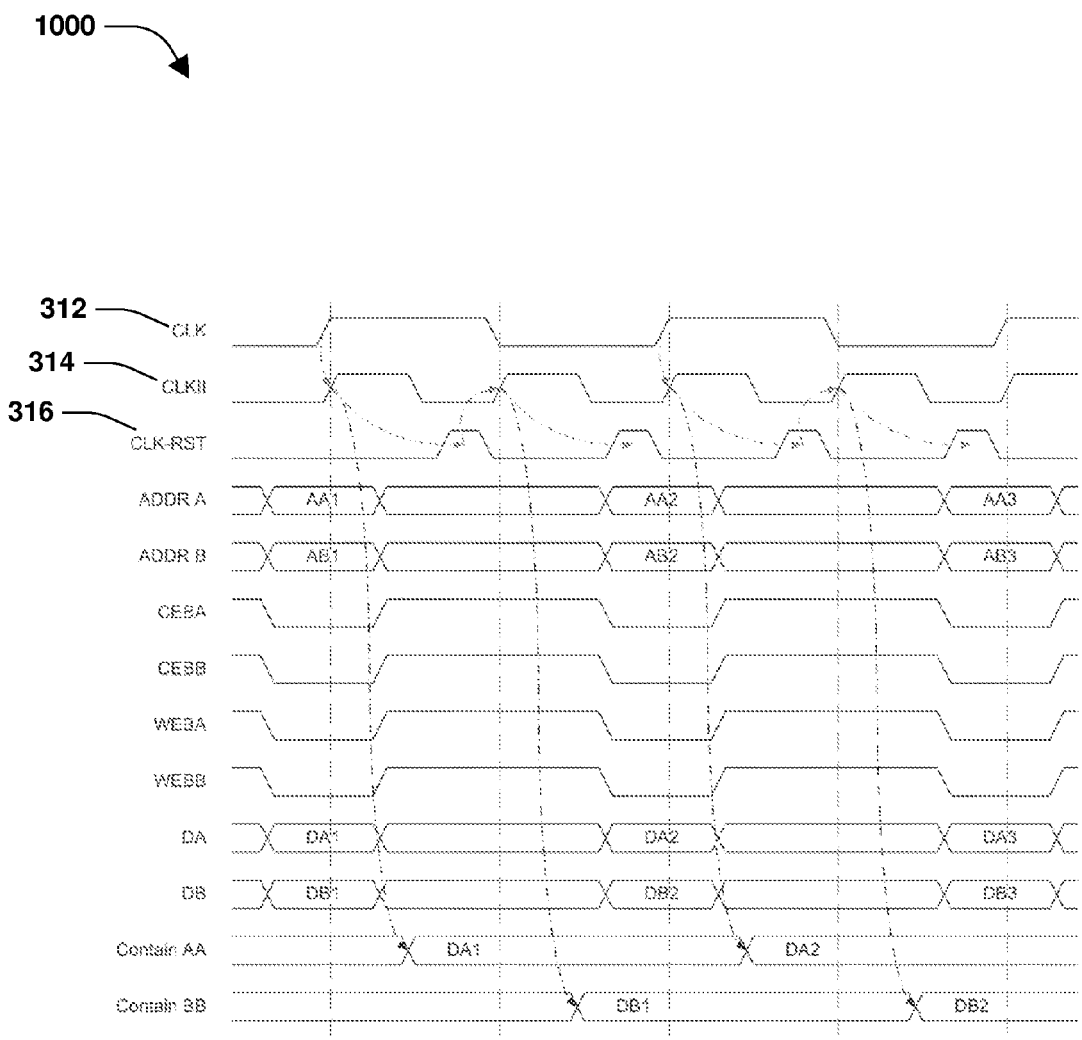
FIG. 10 is an illustration of a waveform of facilitating one or more access operations with utilizing a latch, according to some embodiments.
Figure 11:
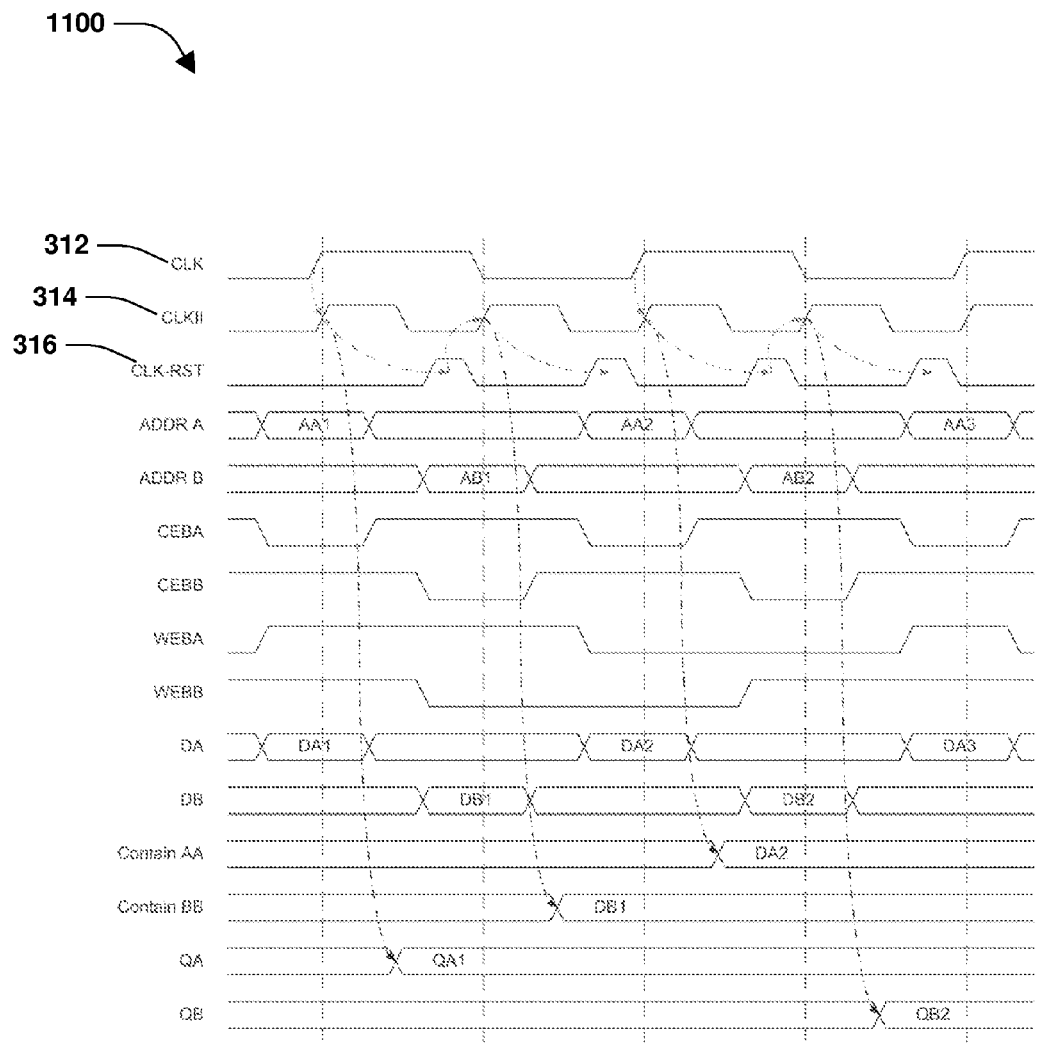
FIG. 11 is an illustration of a waveform of facilitating one or more access operations without utilizing a latch, according to some embodiments.
Figure 12:
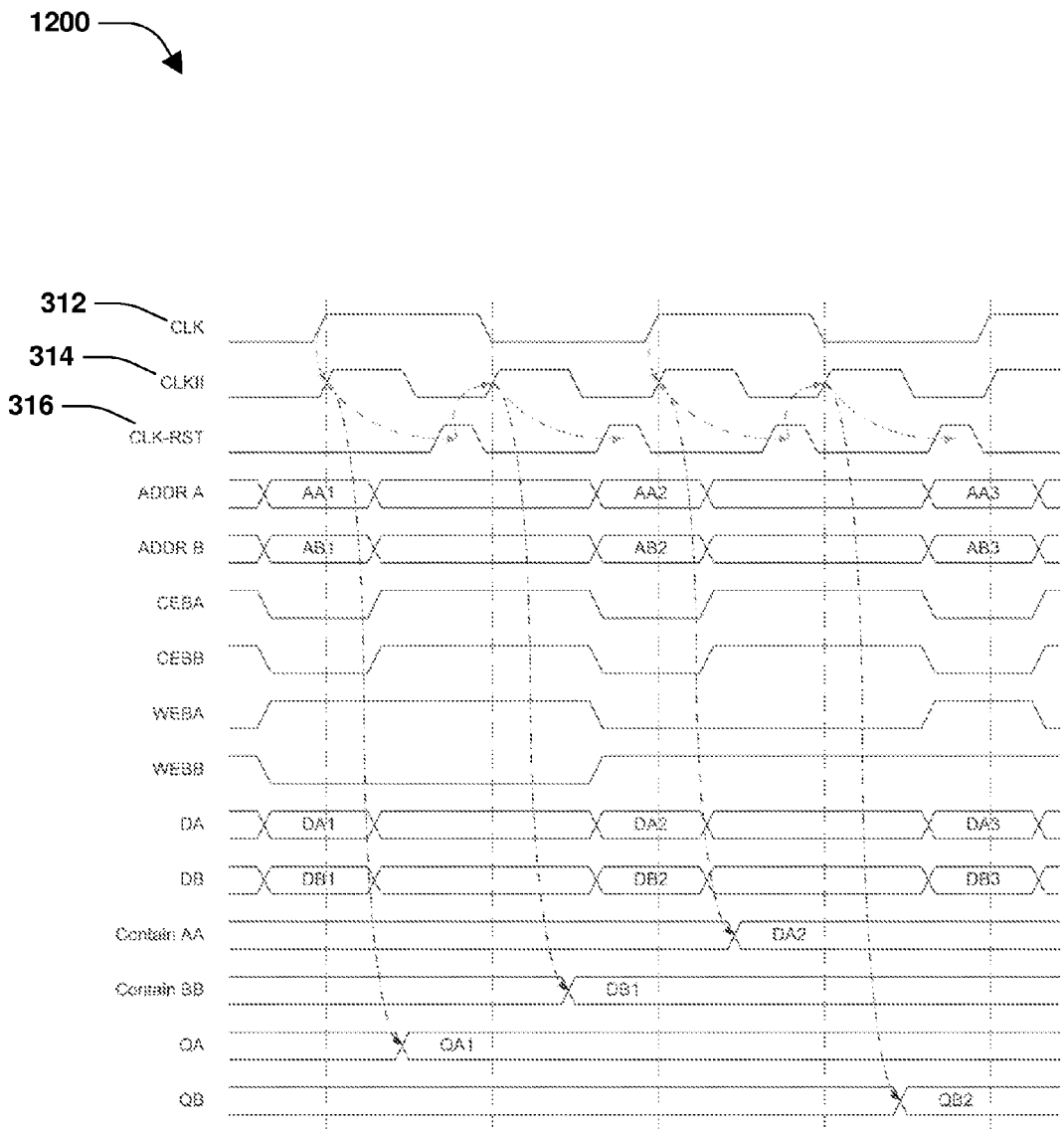
FIG. 12 is an illustration of a waveform of facilitating one or more access operations with utilizing a latch, according to some embodiments.

FIG. 6 is an illustration of a waveform 600 of a first read operation 626 and a second write operation 628 performed during a first clock period 602 of a system clock signal 312, and a first write operation 632 and a second read operation 634 performed during a second clock period 604 of the system clock signal 312.

In an embodiment of the first clock period 602, a multi-clock generator 310 generates a first internal clock signal to initiate a first access operation (first read operation 626) to a single port memory device 202 based upon detecting a first rising edge 624 of the system clock signal 312. An address signal 606 represents a first port address (AA1) received by a first port 304 of a wrapper address component 302. The first port address (AA1) is evaluated to identify a destination bitcell for the first access operation (first read operation 626). A chip enable signal 608 represents a first chip enable signal (CEBA1) received by the first port 304. The first chip enabled signal (CEBA1) and a first write enable signal 610 (WEBA) are evaluated to determine that the first access operation (first read operation 626) is a read operation, as opposed to a write operation, to the single port memory device 202. A first data signal 614 (QA) represents first data (QA1) that is read from the single port memory device 202 by the first read operation 626 during the first clock period 602. Accordingly, the first read operation 626 to the single port memory device 202 is performed during the first clock period 602 based upon the first rising edge 624 of the system clock signal 312.

The multi-clock generator 310 generates a second internal clock signal to initiate a second access operation (second write operation 628) to the single port memory device 202 based upon detecting a first operation complete signal, such as a clock reset signal. The address signal 606 represents a second port address (AB1) received by a second port 306 of the wrapper address component 302. The second port address (AB1) is evaluated to identify a destination bitcell for the second access operation (second write operation 628). The chip enable signal 608 represents a second chip enable signal (CEBB1) received by the second port 304. The second chip enable signal (CEBB1) and a second write enable signal 612 (WEBB) are evaluated to determine that the second access operation (second write operation 628) is a write operation, as opposed to a read operation, to the single port memory device 202. A data signal 618 represents second data (DB1) that is to be written to the single port memory device 202 by the second write operation 628 during the first clock period 602. Accordingly, the second write operation 628 to the single port memory device 202 is performed during the first clock period 602 based upon the first operation complete signal. A second contain signal 622 represents the second data (DB1) written to the single port memory device 202 by the second write operation 628. In this way, multiple access operations are performed during a clock period, such as the first write operation 632 (e.g., a write operation of data (DA2) represented by a first contain signal 620) and the second read operation 634 (e.g., a read operation of data (QB2) represented by a second data signal 616) performed during the second clock period 604 of the system clock signal 312.

According to an aspect of the instant disclosure, a system for facilitating access operations to a single port memory device is provided. The system comprises a wrapper controller configured to initiate a first access operation from a first port of a wrapper address component to a single port memory device during a first clock period. The wrapper controller is configured to receive a first operation complete signal from the single port memory device. Responsive to receiving the first operation complete signal, the wrapper controller initiates a second access operation from a second port of the wrapper address component to the single port memory device during the first clock period.

According to an aspect of the instant disclosure, a system for facilitating access operations to a single port memory device is provided. The system comprises a wrapper address component. The wrapper address component comprises a first port configured to transmit a first port input. The wrapper address component comprises a second port configured to transmit a second port input. The system comprises a wrapper controller. The wrapper controller comprises a multi-clock generator. The multi-clock generator is configured to generate a first internal clock signal based upon a rising edge of a system clock signal during a first clock period of the system clock. The first internal clock signal initiates a first access operation for the first port input to a single port memory device during the first clock period. The multi-clock generator is configured to generate a second internal clock signal based upon a clock reset signal received from the single port memory device during the first clock period. The second internal clock signal initiates a second access operation for the second port input to the single port memory device during the first clock period.

According to an aspect of the instant disclosure, a method for facilitating access operations to a single port memory device. Responsive to identifying a rising edge of a system clock signal during a first clock period of a system clock, generating a first internal clock signal to initiate a first access operation to a single port memory device during the first clock period. Responsive to identifying a first operation complete signal from the signal port memory device during the first clock period, generating a second internal clock signal to initiate a second access operation to the single port memory device during the first clock period Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A system for facilitating access operations to a single port memory device, comprising:
    a wrapper controller configured to:
        initiate a first access operation from a first port of a wrapper address component to a single port memory device during a first clock period;
        receive a clock reset signal from the single port memory device, the clock reset signal indicative of a completion of the first access operation; and
        initiate a second access operation from a second port of the wrapper address component to the single port memory device during the first clock period responsive to receiving the clock reset signal.

2. The system of claim 1, comprising:
    a data wrapper configured to transmit first data associated with the first access operation and second data associated with the second access operation during the first clock period.

3. The system of claim 2, the data wrapper configured to transmit the first data to the single port memory device without latching the first data.

4. The system of claim 1, the first access operation comprising at least one of a first read access operation or a first write access operation, the second access operation comprising at least one of a second read access operation or a second write access operation.

5. The system of claim 1, the wrapper controller comprising:
    a multi-clock generator configured to:
        responsive to identifying a rising edge of a system clock signal associated with the first clock period, generate an internal clock signal to initiate the first access operation.

6. The system of claim 1, the wrapper controller comprising:
    a multi-clock generator configured to:
        generate an internal clock signal to initiate the second access operation responsive to receiving the clock reset signal.

7. The system of claim 1, the wrapper controller configured to facilitate a plurality of access operations to the single port memory device during the first clock period, the plurality of access operations comprising the first access operation, the second access operation, and a third access operation.

8. The system of claim 1, the wrapper controller configured to facilitate the first access operation and the second access operation serially.

9. The system of claim 1, comprising:
    the wrapper address component comprising:
        the first port configured to transmit a first port input; and the second port configured to transmit a second port input.

10. The system of claim 1, the first port configured to receive at least one of a first port address, a first chip enable signal, or a first write enable signal for facilitation of the first access operation.

11. The system of claim 1, the wrapper controller comprising:
a multi-clock generator configured to:
generate a plurality of internal clock signals during the first clock period, the plurality of internal clock signals comprising a first internal clock signal to initiate the first access operation and a second internal clock signal to initiate the second access operation.

12. A system for facilitating access operations to a single port memory device, comprising:
a wrapper address component comprising:
a first port configured to transmit a first port input; and
a second port configured to transmit a second port input; and
a wrapper controller comprising:
a multi-clock generator configured to:
generate a first internal clock signal based upon a rising edge of a system clock signal during a first clock period of a system clock, the first internal clock signal initiating a first access operation for the first port input to a single port memory device during the first clock period; and
generate a second internal clock signal based upon a clock reset signal received from the single port memory device during the first clock period, the second internal clock signal initiating a second access operation for the second port input to the single port memory device during the first clock period.

13. The system of claim 12, comprising:
a data wrapper configured to transmit first data associated with the first access operation and second data associated with the second access operation during the first clock period.

14. The system of claim 12, the single port memory device comprising a 6 transistor bitcell array.

15. The system of claim 12, the wrapper controller configured to facilitate the first access operation and the second access operation serially.

16. A method for facilitating access operations to a single port memory device, comprising:
responsive to identifying a rising edge of a system clock signal during a first clock period of a system clock, generating a first internal clock signal to initiate a first access operation to a single port memory device during the first clock period; and
responsive to receiving a first operation complete signal from the single port memory device during the first clock period, generating a second internal clock signal to initiate a second access operation to the single port memory device during the first clock period.

17. The method of claim 16, comprising:
facilitating the first access operation and the second access operation serially.

18. The method of claim 16, comprising:
transmitting first data associated with the first access operation and second data associated with the second access operation during the first clock period.

19. The method of claim 16, comprising:
evaluating at least one of a first chip enable signal or first write enable signal of a first port of a wrapper address component to determine whether to initiate the first access operation; and
evaluating at least one of a second chip enable signal or a second write enable signal of a second port of the wrapper address component to determine whether to initiate the second access operation.

20. A system for facilitating access operations to a single port memory device, comprising:
a wrapper controller comprising:
a multi-clock generator configured to generate a plurality of internal clock signals during a first clock period, the plurality of internal clock signals comprising:
a first internal clock signal to initiate a first access operation from a first port of a wrapper address component to a single port memory device during the first clock period; and
a second internal clock signal to initiate a second access operation from a second port of the wrapper address component to the single port memory device during the first clock period, the second internal clock signal generated responsive to receiving a first operation complete signal from the single port memory device.

* * * * *